(12) United States Patent
Carey et al.

(10) Patent No.: US 6,992,866 B2
(45) Date of Patent: Jan. 31, 2006

(54) EXCHANGE-COUPLED MAGNETORESISTIVE SENSOR WITH A COERCIVE FERRITE LAYER AND AN OXIDE UNDERLAYER HAVING A SPINAL LATTICE STRUCTURE

(75) Inventors: Matthew Joseph Carey, San Jose, CA (US); Eric Edward Fullerton, Morgan Hill, CA (US); Bruce Alvin Gurney, San Rafael, CA (US); Thai Le, San Jose, CA (US); Stefan Maat, San Jose, CA (US); Philip Milton Rice, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 10/931,315

(22) Filed: Aug. 31, 2004

(65) Prior Publication Data

US 2005/0030674 A1 Feb. 10, 2005

Related U.S. Application Data

(62) Division of application No. 09/841,942, filed on Apr. 24, 2001, now Pat. No. 6,836,392.

(51) Int. Cl.
 *G11B 5/39* (2006.01)
(52) U.S. Cl. .................................. 360/324.11
(58) Field of Classification Search ........... 360/324.11, 360/324.1, 324.32, 327.1
See application file for complete search history.

(56) References Cited

U.S. PATENT DOCUMENTS

| | | | |
|---|---|---|---|
| 5,465,185 A | 11/1995 | Heim et al. | |
| 5,530,609 A * | 6/1996 | Koga et al. | 360/131 |
| 5,949,622 A | 9/1999 | Kamiguchi et al. | |
| 6,111,729 A * | 8/2000 | Kamiguchi et al. | 360/324.1 |
| 6,178,072 B1 | 1/2001 | Gill | |
| 6,208,492 B1 | 3/2001 | Pinarbasi | |

(Continued)

FOREIGN PATENT DOCUMENTS

JP 10032119 2/1998

OTHER PUBLICATIONS

Y. Suzuki, R. B. van Dover, E.M. Gyorgy, Julia m. Phillips, V. Korenivski, D. J. Werder, C. H. Chen, R. J. Cave, J. J. Krajewski; "Structure and magnetic properties of expitaxial spinel ferrite thin films;" Appl. Phys. Lett. 68 (5), Jan. 29, 1996.*

*Primary Examiner*—Brian E. Miller
(74) *Attorney, Agent, or Firm*—G. Marlin Knight

(57) ABSTRACT

An exchange-coupled magnetic structure includes a ferromagnetic layer, a coercive ferrite layer, such as cobalt-ferrite, for biasing the magnetization of the ferromagnetic layer, and an oxide underlayer, such as cobalt-oxide, in proximity to the coercive ferrite layer. The oxide underlayer has a lattice structure of either rock salt or a spinel and exhibits no magnetic moment at room temperature. The underlayer affects the structure of the coercive ferrite layer and therefore its magnetic properties, providing increased coercivity and enhanced thermal stability. As a result, the coercive ferrite layer is thermally stable at much smaller thicknesses than without the underlayer. The exchange-coupled structure is used in spin valve and magnetic tunnel junction magnetoresistive sensors in read heads of magnetic disk drive systems. Because the coercive ferrite layer can be made as thin as 1 nm while remaining thermally stable, the sensor satisfies the narrow gap requirements of high recording density systems.

17 Claims, 13 Drawing Sheets

U.S. PATENT DOCUMENTS

| | | |
|---|---|---|
| 6,313,973 B1 * | 11/2001 | Fuke et al. ............... 360/324.1 |
| 6,338,899 B1 | 1/2002 | Fukuzawa et al. |
| 6,348,274 B1 | 2/2002 | Kamiguchi et al. |
| 6,398,924 B1 | 6/2002 | Pinarbasi |
| 6,411,476 B1 | 6/2002 | Lin et al. |
| 6,567,246 B1 | 5/2003 | Sakakima et al. |
| 6,580,589 B1 | 6/2003 | Gill |
| 6,721,144 B2 * | 4/2004 | Carey et al. ............ 360/324.11 |
| 6,836,392 B2 * | 12/2004 | Carey et al. ............ 360/324.11 |
| 6,870,718 B2 * | 3/2005 | Takahashi et al. ....... 360/327.3 |
| 2002/0003685 A1 | 1/2002 | Takahashi et al. |

* cited by examiner

EXCHANGE-COUPLED MAGNETORESISTIVE SENSOR WITH A COERCIVE FERRITE LAYER AND AN OXIDE UNDERLAYER HAVING A SPINAL LATTICE STRUCTURE

RELATED APPLICATION

This is a divisional application of the application bearing Ser. No. 09/841,942 filed Apr. 24, 2001 which has been allowed now U.S. Pat. No. 6,836,392.

FIELD OF THE INVENTION

This invention relates generally to magnetic devices such as spin valve magnetoresistive (MR) sensors and magnetic tunnel junctions. More particularly, it relates to exchange-coupled magnetic structures containing underlayers that enhance the stability of coercive ferrite layers used to bias the magnetic moment of adjacent ferromagnetic layers.

BACKGROUND ART

Computer systems generally use auxiliary memory storage devices having media on which data can be written and from which data can be read for later use. A direct access storage device (disk drive) incorporating rotating magnetic disks is commonly used for storing data in magnetic form on the disk surfaces. Data are recorded on concentric, radially spaced tracks on the disk surfaces. Magnetic heads including read sensors are then used to read data from the tracks.

A magnetoresistive (MR) sensor detects a magnetic field through the change of its resistance as a function of the strength and direction of the magnetic flux being sensed by the MR layer. Most current MR sensors are based on the giant magnetoresistive (GMR) effect. In GMR sensors, the resistance of the MR sensing layer varies as a function of the spin-dependent transmission of conduction electrons between magnetic layers separated by an electrically conductive non-magnetic spacer layer and the accompanying spin-dependent scattering that takes place at the interface of the magnetic and non-magnetic layers and within the magnetic layers. The external magnetic field causes a variation in the relative orientation of the magnetic moments (magnetizations) of the magnetic layers, thereby affecting the spin-dependent transmission of conduction electrons and the measurable device resistance.

GMR sensors using at least two layers of ferromagnetic material separated by a layer of non-magnetic electrically conductive material are generally referred to as spin valve MR sensors. In a spin valve sensor, one of the ferromagnetic layers, referred to as the pinned layer, has its magnetization pinned by exchange coupling with an antiferromagnetic (AFM) layer. The magnetization of the other ferromagnetic layer, referred to as the free layer, however, is not fixed and is free to rotate in response to the field from the recorded magnetic medium, i.e., the signal field. In spin valve sensors, the resistance varies as the cosine of the angle between the magnetization of the pinned layer and the magnetization of the free layer. Recorded data can be read from a magnetic medium because the external magnetic field from the recorded magnetic medium causes a change in the direction of magnetization in the free layer, which in turn causes a change in resistance of the sensor and a corresponding change in the sensed current or voltage. The sensor is in a low resistive state if the two magnetizations are parallel and a high resistive state if the two magnetizations are antiparallel.

Conventional spin valve MR sensors take on several forms, including simple, antiparallel-pinned, and dual. A simple spin valve MR sensor 100 is shown in cross section in FIG. 1. A free ferromagnetic layer 105 is separated from a pinned ferromagnetic layer 103 by a non-magnetic, electrically conducting spacer layer 104. The magnetization of pinned layer 103, in this case into the paper, is fixed or pinned through exchange coupling with a pinning layer 102, which is typically an AFM material with a high Néel temperature such as NiO. A hard biasing layer 111 sets the magnetization of free layer 105, in this case in the plane of the paper, perpendicular to the magnetization of pinned layer 103, through magnetostatic coupling. A set of leads 112 contact pinned layer 103 to supply sense current to the device; the sense current is measured to detect the varying device resistance induced by the external magnetic field. One or more underlayers 101, such as tantalum, zirconium, nickel-iron, or alumina, are provided to control growth of the successive layers, and the device is typically terminated by a capping layer 106 to prevent corrosion.

In an antiparallel (AP)-pinned spin valve MR sensor, the pinned layer is replaced by a laminated structure that acts as an artificial ferrimagnet. FIG. 2 is a cross-sectional view of an AP-pinned spin valve MR sensor 120 with underlayers 121, a pinning layer 122, a conductive layer 126, a free layer 127, and a capping layer 128 that are identical to layers 101, 102, 104, 105, and 106, respectively, of FIG. 1. However, pinned layer 103 of simple spin valve 100 is replaced by an antiparallel-pinned structure 129 consisting of a ferromagnetic pinned layer 123, an antiferromagnetic coupling layer 124, and a ferromagnetic reference layer 125. The magnetizations of pinned layer 123 and reference layer 125 are coupled antiparallel to each other through coupling layer 124 and are perpendicular to the magnetization of free layer 127. AP-pinned spin valves are advantageous because the net magnetic moment of AP-pinned structure 129, the difference between the two antiparallel moments of the component ferromagnetic layers, can be varied independently of the thickness of pinned layer 123. Thus it is possible to balance the overall moment of the spin-valve while choosing a preferred thickness for the pinned layer 123. Furthermore, AP-pinned spin valves also exhibit a greatly enhanced stability in comparison with simple spin valves, since the coupling between pinned layer 123 and reference layer 125 is quite high.

A dual spin valve is a simple or AP-pinned spin valve with a second set of conductive, pinned, and antiferromagnetic layers deposited on top of it. Each of the pinned layers can be either a single ferromagnetic layer or an artificial ferrimagnetic layer as described above. Dual spin valves exhibit an enhanced sensitivity, but are much thicker and typically show a lower resistance than the previously described simple and AP-pinned spin valves.

As a real recording densities in magnetic media continue to increase, smaller magnetoresistive sensors with higher signals are required. MR signals are measured as $\Delta R/R$, the percent change in device resistance as the ferromagnetic layer magnetizations switch between parallel and antiparallel. Specifically, as densities approach 100 $Gbit/in^2$, the gap between the shields of the read head, in which the sensor is positioned, must decrease from current thickness of 0.1 $\mu m$ to between 50 and 70 nm. Smaller sensors require thinner layers, which tend to produce lower signals. NiO pinning layers are unsatisfactory in these thickness regimes because of their low magnetic anisotropy energy, which leads to a weak pinning field and a high critical layer thickness. The low ordering temperature of NiO also causes thermally unstable pinning. As a solution to this problem, cobalt-ferrite pinning layers were introduced in co-pending U.S. patent application Ser. No. 09/755,556, filed Jan. 4, 2001, (issued as U.S. Pat. No. 6,721,144) is herein incorporated by reference.

While cobalt-ferrite provides a number of advantages over NiO and other standard AFM pinning layer materials, it also introduces two problems. First, coercive ferrites are thermally unstable in the thickness regime of approximately 30 nm or less, which is required for 50-nm gap sensors. Second, unlike AFM pinning layers, ferrites exhibit a substantial magnetic moment that contributes to the overall device moment, making it difficult to balance the device moment as required for stable and consistent operation. Thicker layers contribute a greater moment, and so reducing the pinning layer thickness while maintaining thermal stability would address both problems.

1 Spin valves containing an oxidized iron layer inserted at the pinned layer/NiO pinning layer interface are disclosed in R. F. C. Farrow et al., "Enhanced blocking temperature in NiO spin valves: Role of cubic spinel ferrite layer between pinned layer and NiO," Applied Physics Letters, 77(8), 1191–1193 (2000). The iron oxide layer is converted to a cubic spinel nickel-ferrite ($Ni_{0.8}Fe_{2.2}O_4$) by solid-state reaction with the NiO layer during annealing. The exchange bias field originates from both the NiO pinning layer and the nickel-ferrite layer. Nickel-ferrite has a relatively low coercivity; for example, it is generally not possible to grow nickel-ferrite with coercivities of 1 kOe. While nickel-ferrite/NiO spin valves display increased blocking temperature (temperature at which the exchange field drops to zero) and improved thermal stability, they cannot fit within a 50 nm sensor gap.

1 There is still a need, therefore, for an improved exchange-coupled magnetic structure that uses coercive ferrite pinning layers and remains thermally stable when reduced to the thicknesses required for magnetic read heads.

OBJECTS AND ADVANTAGES

Accordingly, it is a primary object of the present invention to provide a spin valve magnetoresistive sensor that remains thermally stable when thinned sufficiently to fit within a 50-nm gap.

It is a further object of the invention to provide an underlayer for coercive ferrite pinning layers that increases the coercivity and thermal stability of the pinning layers of a given thickness.

It is an additional object of the invention to provide an underlayer for coercive ferrite pinning layers that allows the pinning layer to be thinned to as low as 1 nm.

It is another object of the invention to provide a MR sensor that can be fabricated to desired thicknesses using standard fabrication techniques.

SUMMARY

These objects and advantages are attained by a magnetoresistive (MR) sensor having at least three layers: a ferromagnetic layer, a coercive ferrite layer for biasing the magnetization of the ferromagnetic layer, and an oxide underlayer in proximity to the coercive ferrite layer. The structure of the underlayer favorably affects the growth and structure of the coercive ferrite layer and therefore its magnetic properties, providing enhanced stability at smaller thickness.

The oxide underlayer, which is preferably sputter, ion-beam, pulsed laser, or chemical vapor deposited, has either a rock salt or spinel lattice structure and exhibits no magnetic moment at room temperature; that is, the underlayer is either diamagnetic, paramagnetic, or antiferromagnetic. For example, the oxide underlayer can be $ZO_{1+x}$, where $-0.3 \leq x \leq 0.3$ and Z is Co, Ni, Mg, Mn, or one of their alloys. Alternatively, the underlayer can be $Co_3O_4$, $MgAl_2O_4$, or an alloy of $Co_3O_4$ or $MgAl_2O_4$. The coercive ferrite layer, which has a thickness of between 1 and 30 nm, is either $Co_xFe_{3-x}O_4$, where $0 \leq x \leq 1.5$ (preferably $x=1$), $SrFe_{12}O_{19}$, $BaFe_{12}O_{19}$ or one of their alloys with Si, Ti, Mg, Al, Mo, Os, Re, Ru, or W. The underlayer is either in direct contact with the coercive ferrite layer or separated from it by an intermediate layer that preserves the structural effect of the underlayer on the coercive ferrite layer.

The MR sensor also contains upper and lower shields defining a gap of width less than 50 nm. In one embodiment, the MR sensor is a spin valve MR sensor, the ferromagnetic layer is a pinned layer, and the coercive ferrite layer is a pinning layer that pins the magnetization of the pinned layer. In another embodiment, the ferromagnetic layer is a free layer and the coercive ferrite layer is a hard-bias layer that biases the magnetization of the free layer. For example, the MR sensor can be a simple, antiparallel-pinned, or dual spin valve MR sensor or a magnetic tunnel junction MR sensor. In a third embodiment, the ferromagnetic layer is a free layer of a spin valve MR sensor and the coercive ferrite layer is an in-stack biasing layer that biases the magnetization of the free layer.

The present invention also provides an exchange-coupled magnetic structure containing a ferromagnetic layer, a coercive ferrite layer, and an oxide underlayer in proximity to the coercive ferrite layer. An exchange bias field from the coercive ferrite layer biases the magnetization of the ferromagnetic layer. The oxide underlayer has either a rock salt type or spinel lattice structure and exhibits no magnetization at room temperature. For example, the ferromagnetic layer is a free layer whose magnetization is biased by the coercive ferrite layer, and the structure also includes a pinned ferromagnetic layer and an insulating barrier layer separating the pinned ferromagnetic layer from the free layer. In this case, the structure is a magnetic tunnel junction.

Also provided is a magnetic disk drive system containing a magnetic recording disk, a magnetoresistive read/write head containing a MR sensor, an actuator for moving the read/write head across the magnetic recording disk, and a motor for rotating the magnetic recording disk relative to the read/write head. The MR sensor contains at least one exchange-coupled magnetic structure of the present invention as described above.

DETAILED DESCRIPTION

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

The present invention provides an exchange-coupled magnetic structure, magnetoresistive (MR) sensors incorporating the structure, and a magnetic disk drive system including a magnetic read/write head containing the MR sensor. All of the devices contain oxide underlayers, e.g., CoO or $Co_3O_4$, on which a coercive ferrite biasing or pinning layer is grown. The magnetic properties of a magnetic thin film can be altered significantly with the proper choice of underlayer, as underlayers are known to influence crystalline growth direction and growth mode of subsequent layers. Because magnetic properties are dependent on structural properties, the underlayers of the present invention affect coercivity, magnetic moment, and squareness of subsequent layers of magnetic thin films, allowing the biasing layer to be thinned considerably. The resulting underlayer/biasing layer bilayer is of comparable or lower thickness than a coercive ferrite layer without an underlayer, is stable at higher temperatures, and contributes a lower moment to the device. All embodiments of the invention discussed below contain an oxide underlayer, a coercive ferrite layer, and a ferromagnetic layer whose magnetization is biased by the coercive ferrite layer.

First Embodiment—Spin Valve Magnetoresistive Sensor

Figure 3A:
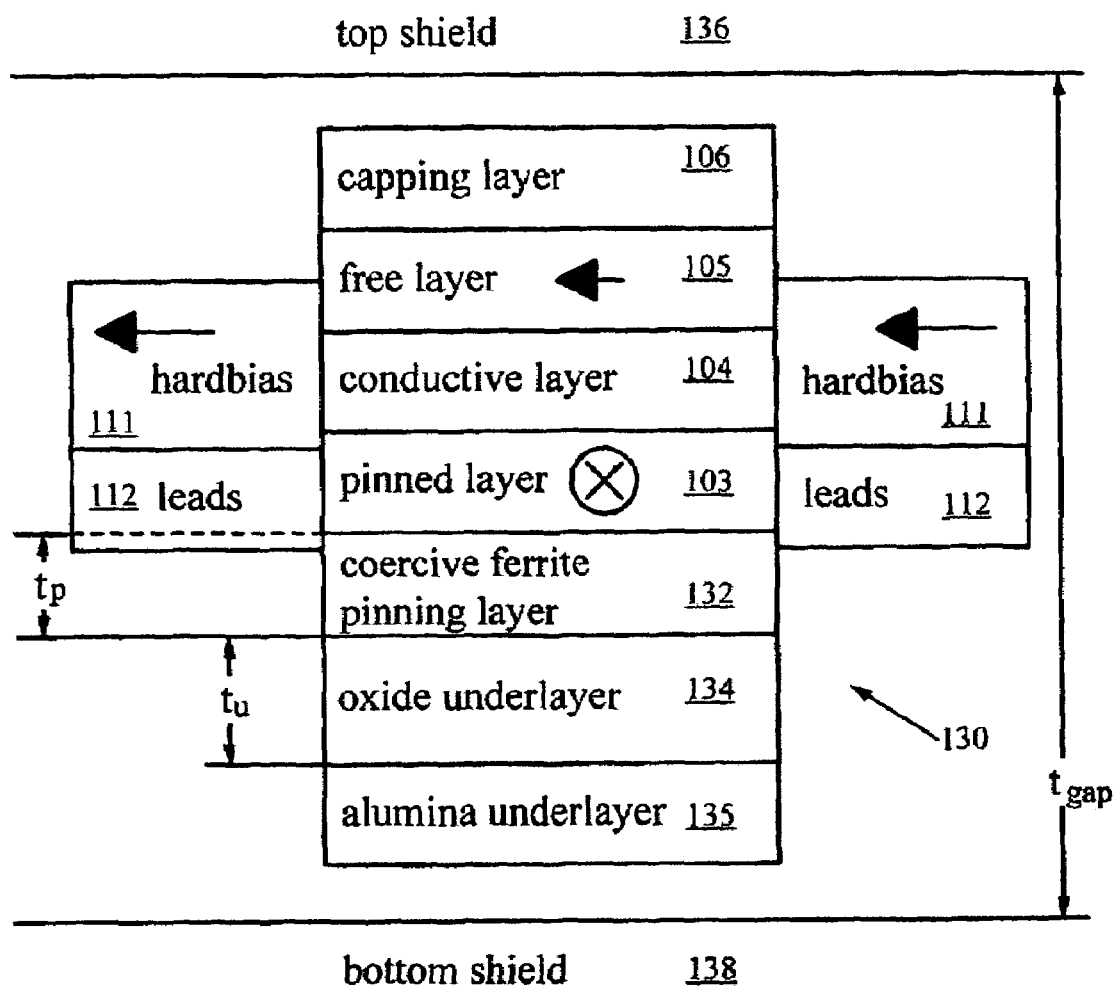
FIG. 3A is a cross-sectional view of a simple spin valve MR sensor of the present invention.

FIG. 3A illustrates the underlayer of the present invention in a simple spin valve magnetoresistive sensor 130, shown in cross section. Sensor 130 contains substantially the same layer structure as prior art spin valve MR sensor 100, including pinned layer 103, conductive layer 104, free layer 105, capping layer 106, hard-bias material 111, and leads 112. It also contains a coercive ferrite pinning layer 132 of thickness $t_p$ and an oxide underlayer 134 of thickness $t_u$. As explained below, oxide underlayer 134 directs the growth of coercive ferrite layer 132, thereby increasing its coercivity and thermal stability. As a result, coercive ferrite layer 132 can be made very thin; $t_p$ is between 1 and 30 nm; $t_u$ is between 1 and 30 nm. Sensor 130 fits in a gap of thickness $t_{gap}$ between a top shield 136 and a bottom shield 138 of a magnetic read head. Sensor 130 also typically contains an insulating underlayer 135 such as alumina.

Underlayer 134 has a crystalline structure either of rock salt (e.g., CoO) or of a spinel (normal, inverse, or mixed) that exhibits no magnetic moment at room temperature (e.g., $Co_3O_4$). Such underlayers were found by the present inventors to enhance significantly the thermal stability of spin valves incorporating cobalt ferrite, a coercive ferrite, as a pinning layer 132 and $t_p$ can be reduced to as low as 1 nm while maintaining sufficient thermal stability of pinning layer 132. Since coercive ferrites are ferrimagnets, they exhibit a moment. The reduced thickness of coercive ferrite layer 132 therefore also makes it easier to balance the overall moment of spin valve 130. The thermal stability of the inventive coercive ferrite-based sensors with suitable oxide underlayers (e.g., 3 nm $CoFe_2O_4$ and 17 nm CoO) is also superior to present PtMn-based sensors of comparable thickness. Furthermore, because oxide underlayer 134 is insulating, the thickness of $Al_2O_3$ underlayer 135 can also be reduced, contributing to the compatibility of sensor 130 with a 50 nm gap.

Figure 3B:
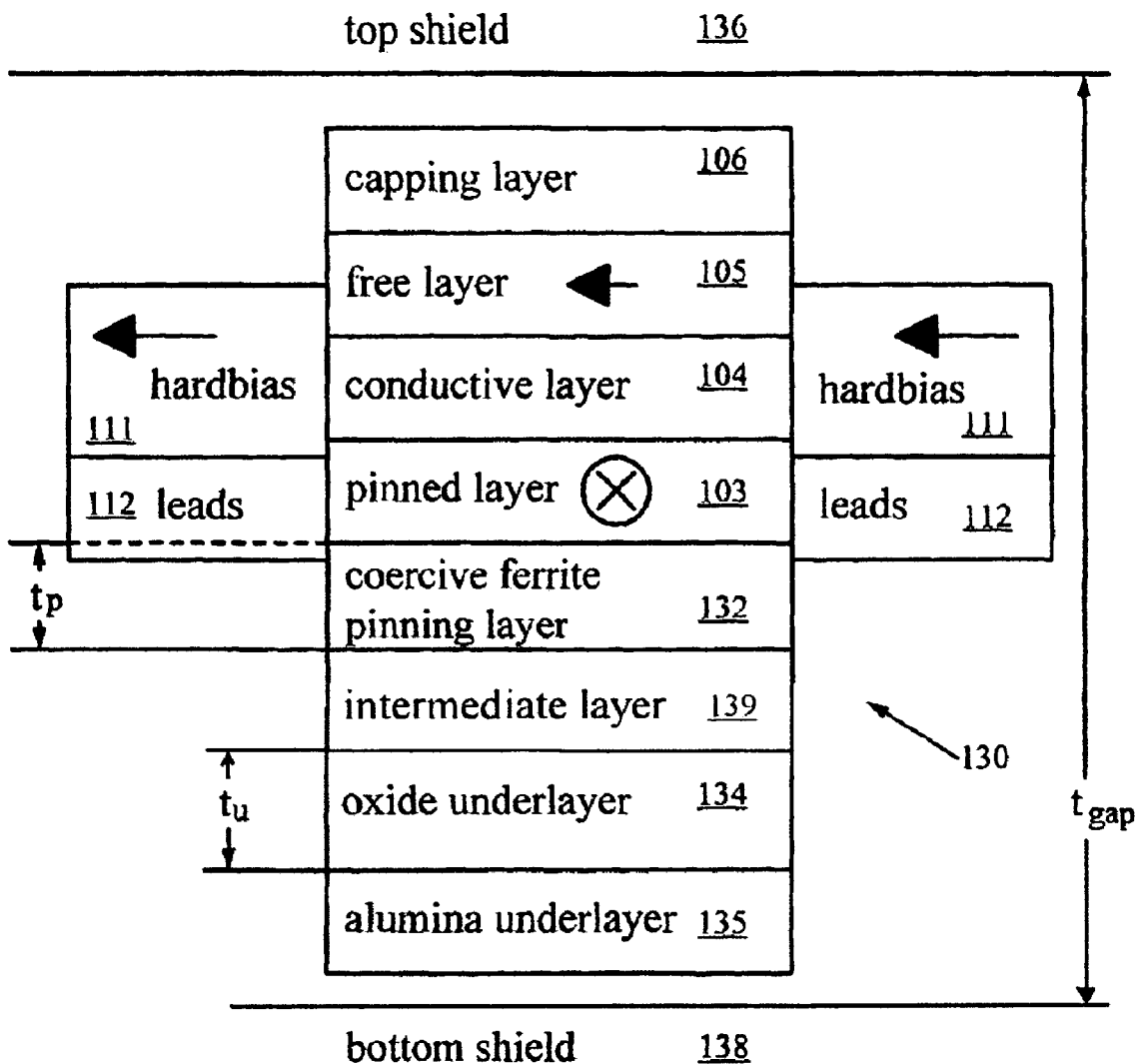
FIG. 3B shows the spin valve MR sensor of FIG. 3A with an optional intermediate layer deposited between an underlayer and a coercive ferrite layer.

In spin valve 130, underlayer 134 contacts coercive ferrite layer 132 directly. Alternatively, as shown in FIG. 3B an intermediate layer 139 can be deposited between underlayer 134 and coercive ferrite layer 132. The intermediate layer 139 is a nanolayer that preserves the effect of underlayer 134 on the structure of coercive ferrite layer 132. Nanolayers are commonly used to improve the growth mode of subsequent layers. For example, a nanolayer of a material with low surface free energy can be deposited onto underlayer 134 in order to smooth the interface for the subsequent deposition of coercive ferrite layer 132. The structure of the nanolayer is determined by the structure of underlayer 134 and therefore directs the structure of pinning layer 132.

While spin valve magnetoresistive sensors are particularly useful applications of the present invention, the inventive underlayers may be used in any suitable exchange-coupled magnetic structure. The inventive oxide underlayers of coercive ferrites affect the structural and resultant magnetic properties of the coercive ferrites, enhancing their performance in biasing the magnetic moment (magnetization) of a nearby ferromagnetic layer of the structure for a variety of applications. Additional applications are discussed below.

As used herein, coercive ferrites, for example as pinning layer 132, are ferrites capable of being deposited with coercivities of at least 1 kOe. Examples include cobalt-ferrite, strontium-ferrite, and barium-ferrite and their alloys with Si, Ti, Mg, Al, Mo, Os, Re, Ru, or W. Note that nickel-ferrite typically can only be grown with coercivities much less than 1 kOe and is therefore not a coercive ferrite. As used herein, cobalt-ferrites include any material with a formula $Co_xFe_{3-x}O_4$, where $0 \leq x \leq 1.5$. When a cobalt-ferrite pinning layer is used, x is preferably 1, i.e., the cobalt-ferrite is $CoFe_2O_4$. Preferable Ba-ferrites and Sr-ferrites are $Ba_{12}O_{19}$ and $SrFe_{12}O_{19}$, respectively. Ba-ferrite and Sr-ferrite have a hexagonal lattice symmetry that provides high magnetic anisotropy, unlike cubic ferrites such as Co-ferrite. While the experimental results described below refer to $CoFe_2O_4$ as the pinning layer, it is to be understood that the results are for illustration purposes only and in no way limit the scope of the present invention.

Figure 4A:
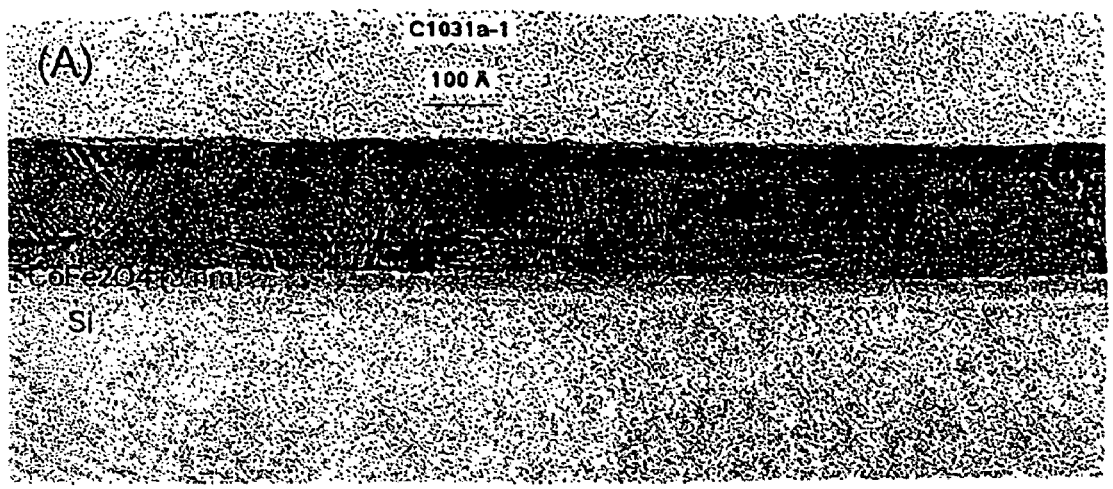
FIGS. 4A–4C are TEM cross-sections of AP-pinned spin-valves without an underlayer (FIG. 4A) and with a 17 nm Co-oxide underlayer, at medium (FIG. 4B) and high (FIG. 4C) resolutions.
Figure 4B:
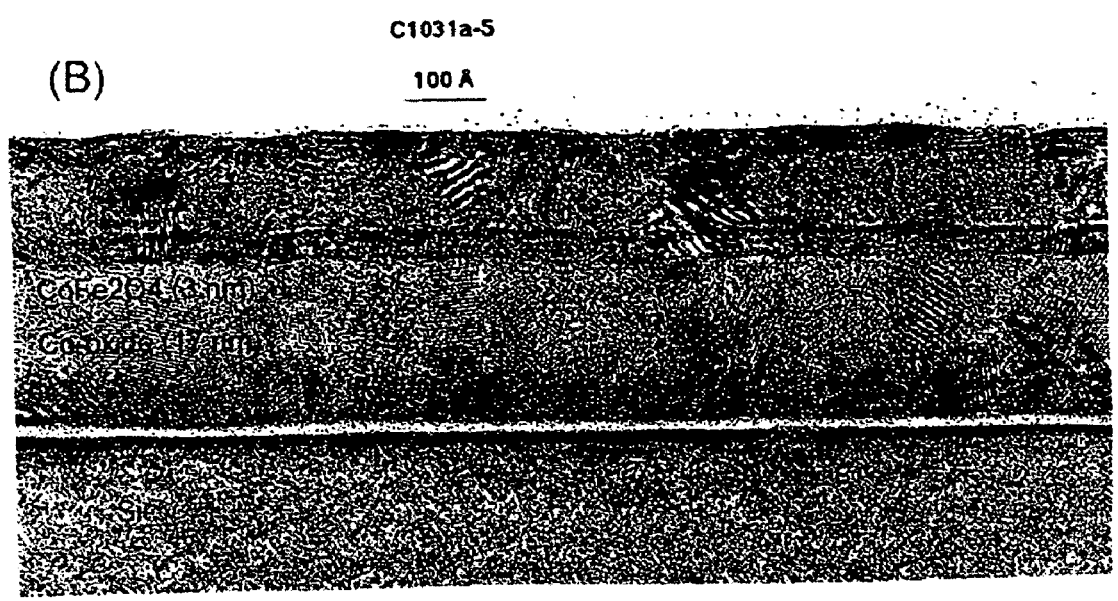
Figure 4C:
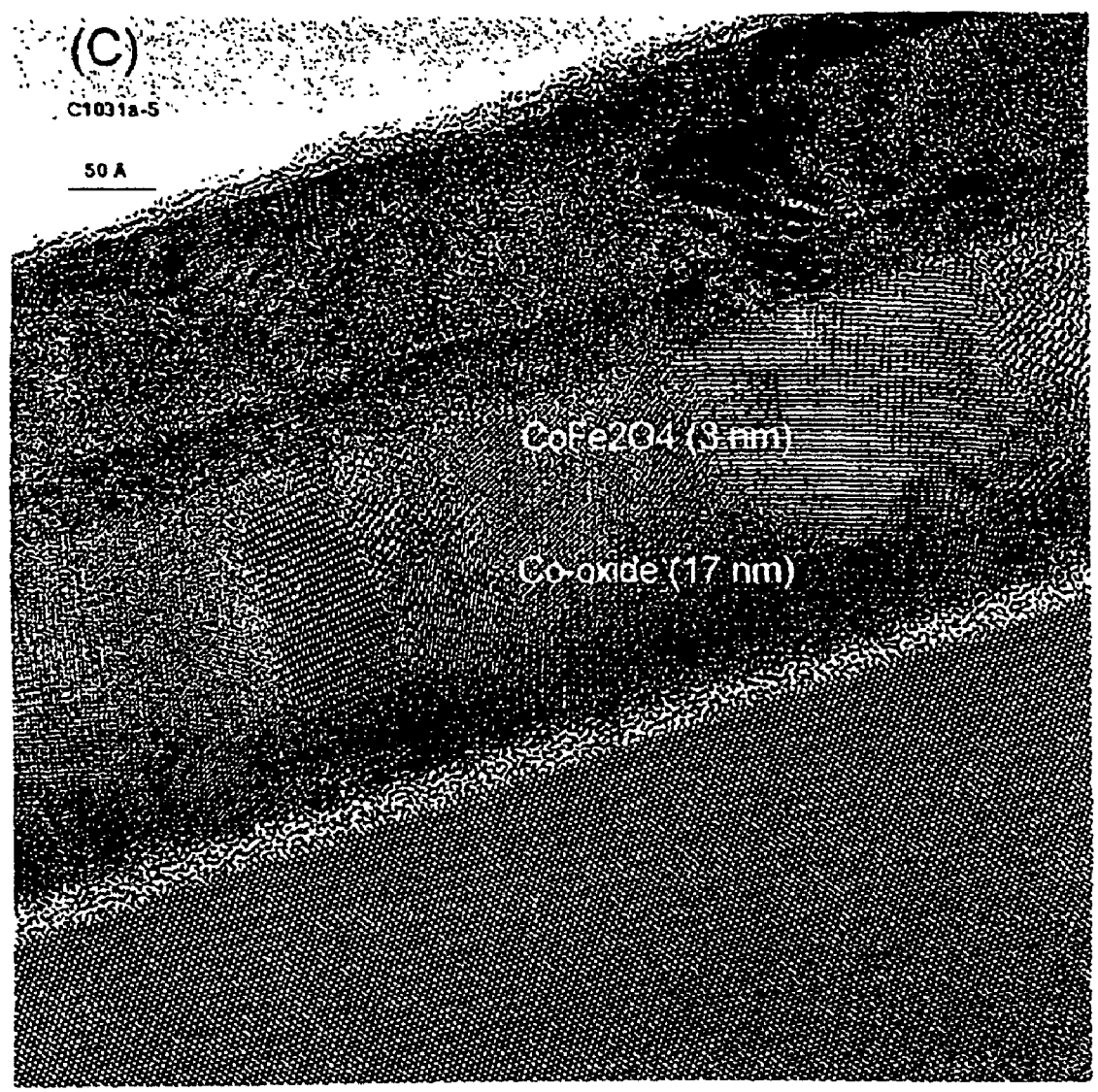

Transmission electron microscope (TEM) cross-sections of two AP-pinned spin valves without and with a 17-nm Co-oxide underlayer are shown in FIGS. 4A and 4B, respectively. The pinning layer in both cases is a 3-nm thick $CoFe_2O_4$ layer. In FIG. 4A, the $CoFe_2O_4$ pinning layer can easily be identified on the silicon substrate. In FIG. 4B, the $CoFe_2O_4$ layer is indistinguishable from the Co-oxide underlayer because of low contrast between the two layers. From lattice constant considerations, the top ~12 nm of the Co-oxide underlayer can be identified as $Co_3O_4$. The TEM cross-section in FIG. 4B shows a high amount of crystallinity in the Co-oxide and $CoFe_2O_4$ layers. Much less crystalline order is observed in FIG. 4A, in which the $CoFe_2O_4$ layer is grown without an underlayer. A high-resolution image of the spin valve with Co-oxide underlayer is shown in FIG. 4C. From this image it can be inferred that the ferrite grows pseudo-epitaxially on the Co-oxide grains.

The TEM cross-sections (along with data presented below) indicate that the enhanced coercivity and improved thermal stability of thin $CoFe_2O_4$ films grown onto CoO or $Co_3O_4$ is of structural rather than magnetic origin. Therefore the enhanced coercivity and improved thermal stability can also be observed for coercive ferrites grown onto other underlayers with chemical structure similar to CoO or to $Co_3O_4$. For information on the chemical structure of oxides, see J. R. Smyth et al., "Comparative Crystal Chemistry of Dense Oxide Minerals," chapter 9 in Comparative Crystal Chemistry, Reviews in Mineralogy, vol. 40 (2000), herein incorporated by reference.

In particular, CoO has a crystalline structure that is referred to as a rock salt type lattice structure, so named because it is the structure of NaCl (rock salt). The rock salt structure is a cubic close packed (face-centered cubic) anion lattice, with cations in the octahedral holes. The coordination number (number of nearest neighbors of opposite charge) of each cation and each anion is six. A unit cell contains four formula units of CoO. In the present invention, similar effects as observed for CoO can be observed for $CoFe_2O_4$ grown onto other underlayers with a chemical structure of rock salt and with similar lattice constant to that of CoO.

Thus the present invention can be implemented with any underlayer having a rock salt type lattice structure with similar lattice constant to that of CoO. The underlayer preferably exhibits no magnetization at room temperature, i.e., is neither ferromagnetic nor ferrimagnetic. For example, suitable underlayers include $ZO_{1+x}$, where $-0.3 \leq x \leq 0.3$ and Z is Co, Ni, Mg, Mn, or their alloys. Note that excess oxygen (i.e., $x \geq 0$) can be introduced into the alloy without changing the crystal structure of the underlayer.

$Co_3O_4$ has a spinel crystalline structure. Spinels have a general formula $XY_2O_4$, where X and Y are cations with variable valence. Oxygen atoms are arranged in cubic closest packing along (111) planes of the structure. The cations are interstitial to the oxygen framework and in octahedral and tetrahedral coordination with oxygen. In a unit cell of spinel, there are 32 possible octahedral sites and 64 possible tetrahedral sites; of these, 16 octahedral and 8 tetrahedral sites are occupied by cations. In a normal spinel, the X cations occupy the eight tetrahedral sites and the Y cations occupy the 16 octahedral sites. In an inverse spinel, 8 of the 16 Y cations occupy the tetrahedral sites. In a mixed spine, the Y cations occupy the tetrahedral and octahedral sites randomly.

For the present invention, any underlayer can be used that exhibits no magnetic moment at room temperature and that has the chemical structure of a normal, inverse, or mixed spinel with a similar lattice constant to that of $Co_3O_4$. For example, suitable underlayers include $Co_3O_4$, $MgAl_2O_4$ or alloys of $Co_3O_4$ or $MgAl_2O_4$.

The following data describe simple and AP-pinned spin valves that have $CoFe_2O_4$ pinning layers and CoO and $Co_3O_4$ underlayers. As shown by the data, the addition of CoO or $Co_3O_4$ underlayers significantly improves the stability of thin $CoFe_2O_4$ pinning layers, making them suitable for narrow read-gap applications. In fact, the oxide underlayers make it possible to use cobalt-ferrite pinning layers as thin as 1 nm, a significant improvement from the tens of nanometers required without an underlayer. The overall oxide thickness is approximately 30 nm. The metallic layers, pinned layer, conduction layer, free layer, and capping layer are approximately 17 nm. Since the underlayer and the ferrite are insulating, reducing the thickness for the alumina substrate, it is possible to fit the sensor into a gap as thin as 50 nm.

CoO, $Co_3O_4$, and $CoFe_2O_4$ films were grown by DC magnetron sputtering from 2-inch planar targets in a UHV sputtering system under an argon/oxygen gas mixture at a pressure of 2 mTorr. The typical base pressure of the system was approximately $10.\text{sup.}-8$ Torr. The CoO and $Co_3O_4$ underlayers were sputtered from a cobalt target at 200 mA and 100 mA, respectively, with 45% oxygen in the argon sputtering gas. The $CoFe_2O_4$ films were sputtered from a $CO_{0.33}Fe_{0.67}$ target at 200 mA with 50% oxygen. After deposition of the cobalt-oxide and cobalt-ferrite layers, the system was pumped for 30 min to purge the oxygen. The subsequent metallic layers were DC-magnetron sputtered at a pressure of 2 mTorr of argon. All layers were deposited at room temperature. After deposition, the spin valves were annealed in a 10 kOe magnetic field at 200 degree C. for 1 hour.

Alternatively, the layers can be deposited by any other suitable deposition method. For example, they can be deposited by ion-beam, pulsed laser, or chemical vapor deposition using techniques known in the art.

Figure 5:
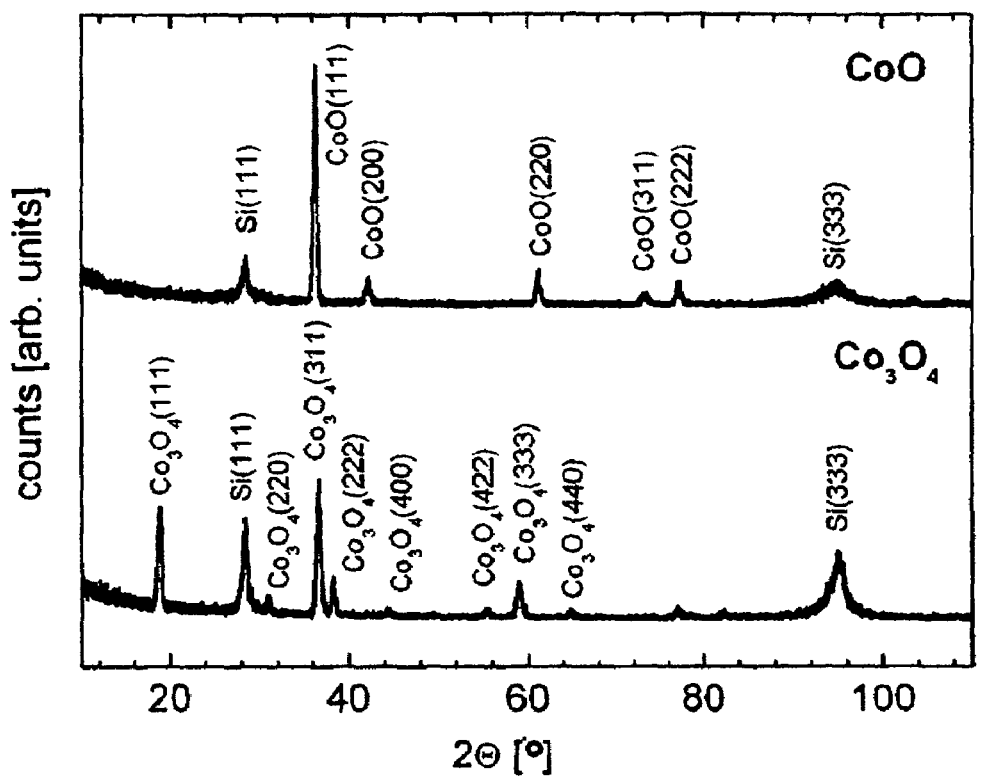
FIG. 5 is a radial X-ray diffraction spectrum of polycrystalline CoO and $Co_3O_4$ grown on Si (100).

The chemical phases of the cobalt-oxides were confirmed by radial X-ray spectra, shown in FIG. 5. The position of the peaks for both CoO (top) and $Co_3O_4$ (bottom) are consistent with their powder diffraction files, numbers 78–0431 and 74–2120, respectively. The CoO (200) and $Co_3O_4$ (111) peaks are in unique positions. These peaks, together with other peaks in the spectrum, identify CoO and $Co_3O_4$.

Figure 6:
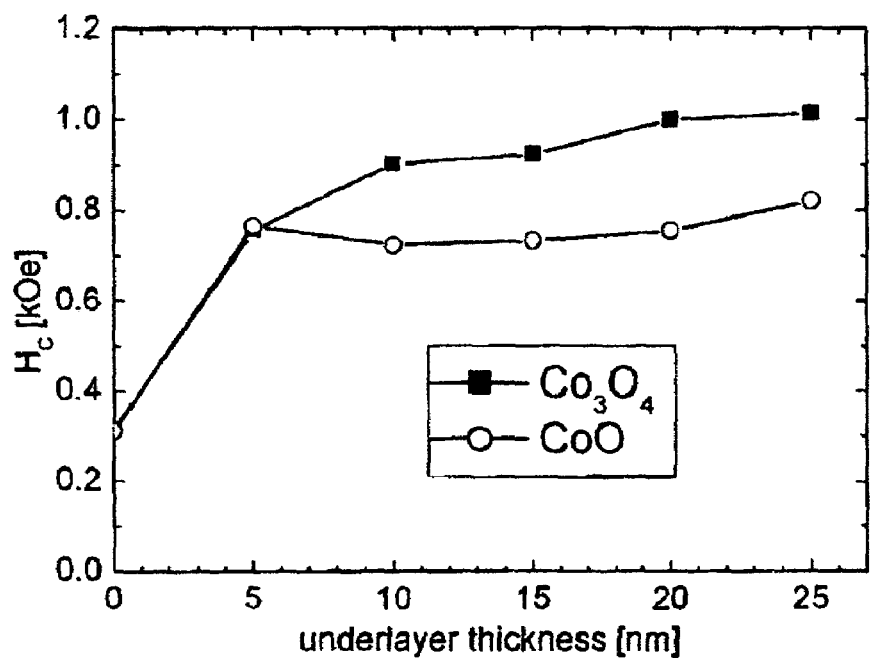
FIG. 6 is a plot of coercivity versus underlayer thickness for simple spin valves containing CoO and $CO_3 3O_4$ underlayers in the following structure: underlayer (x nm)/$CoFe_2O_4$ (25 nm)/$Co_{0.84}Fe_{0.16}$ (2 nm)/Cu (2.5 nm)/$Co_{0.84}Fe_{0.16}$ (2 nm)/$Ni_{80}Fe_{20}$ (4 nm)/Ru (3 nm).

FIG. 6 is plot of coercivity ($H_c$) as a function of underlayer thickness for simple spin valves containing CoO and $Co_3O_4$ underlayers. Coercivity values are obtained from magnetoresistance curves (magnetoresistance vs. applied field) of the spin valve. The structure of this spin-valve, represented as underlayer/pinning layer/pinned layer/conductive layer/free layer/capping layer, is: underlayer (x nm)/$CoFe_2O_4$ (25 nm)/$Co_{0.84}Fe_{0.16}$ (2 nm)/Cu (2.5 nm)/$Co_{0.84}Fe_{0.16}$ (2 nm)/$Ni_{80}Fe_{20}$ (4 nm)/Ru (3 nm). For both CoO and $Co_3O_4$, the coercivity increases monotonically with underlayer thickness, from 300 Oe for no underlayer to 1000 Oe for a 25-nm $Co_3O_4$ underlayer and 800 Oe for a 25-nm CoO underlayer. For a given underlayer thickness, the coercivity is equal or higher for $Co_3O_4$ than for CoO. In both cases, however, the coercivity is substantially greater than without the oxide underlayer.

Figure 7:
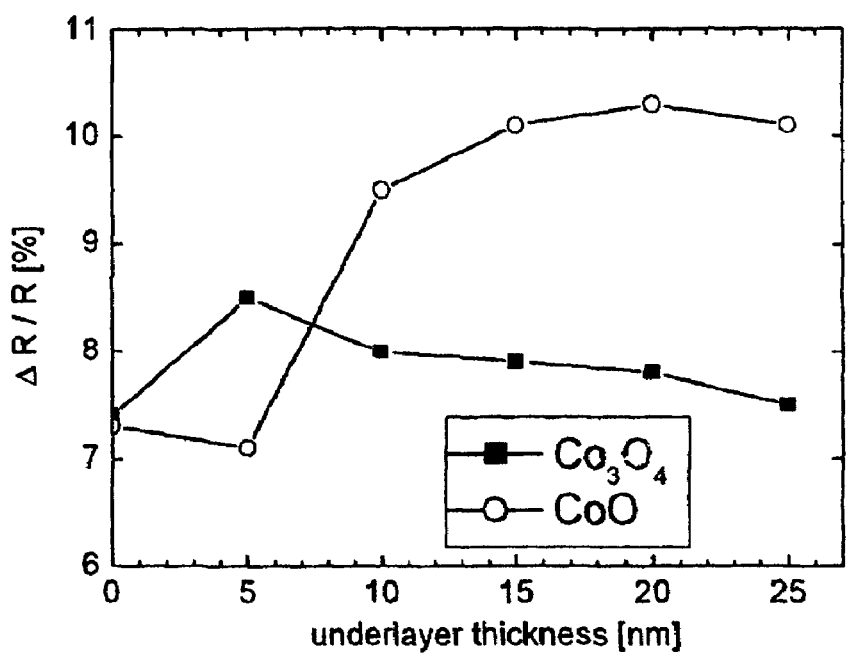
FIG. 7 is a plot of magnetoresistive ratio ($\Delta R/R$) versus underlayer thickness for the simple spin valves of FIG. 6. $Co_3O_4$

FIG. 7 is a plot of spin valve magnetoresistance ratio, ΔR/R, as a function of underlayer thickness for both CoO and $Co_3O_4$ underlayers in the simple spin valves of FIG. 6 (25-nm pinning layer). ΔR/R measures the change in resistance of the device between parallel and antiparallel orientation of the magnetizations of the free and pinned ferromagnetic layers. In general, it is desirable for MR sensors to have a large value of ΔR/R. As shown in the plot, the magnetoresistance values increase from ~7.3% for no underlayer to ~10.5% with a 25 nm CoO underlayer. The magnetoresistance values for $Co_3O_4$ remain approximately constant as the underlayer thickness is increased.

Figure 8:
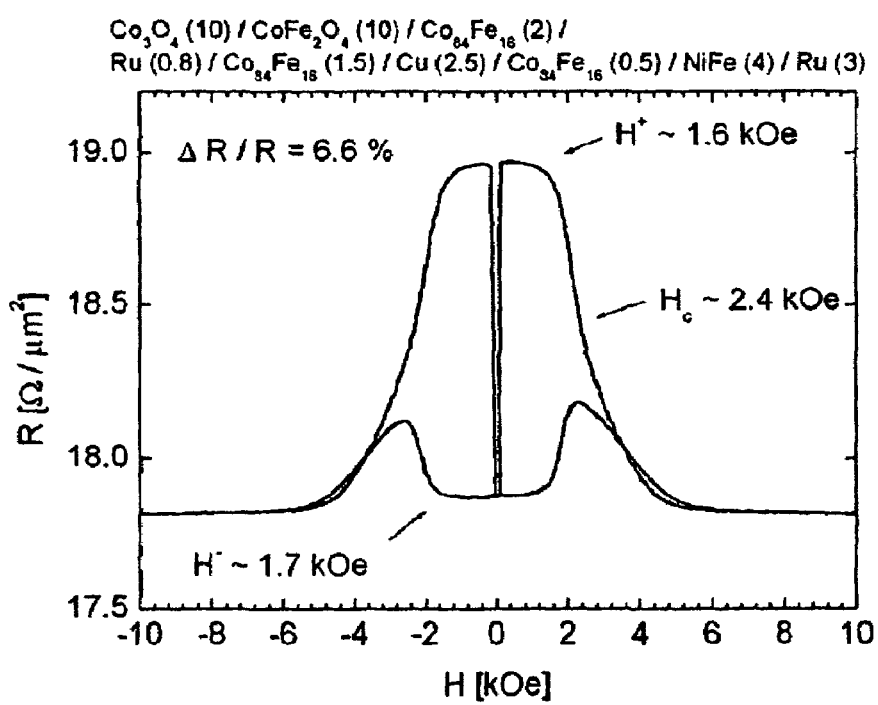
FIG. 8 is a plot of magnetoresistance versus applied magnetic field H for an AP-pinned spin valve with a $Co_3O_4$ underlayer and a structure of $Co_3O_4$ (10 nm)/$CoFe_2O_4$ (10 nm)/$CO_{0.84}Fe_{0.16}$ (2 nm)/Ru (0.8 nm)/$Co_{0.84}Fe_{0.16}$ (1.5 nm)/Cu (2.5 nm)/$Co_{0.84}Fe_{0.16}$ (0.5 nm)/NiFe (4 nm)/Ru (3 nm). The critical fields $H^+$ and $H^-$ and the coercivity $H_c$ are indicated in the figure.

Since ferrites exhibit a magnetic moment, it is advantageous to grow anti-parallel (AP)-pinned spin valves to balance the overall moment of the device. For spin valves, magnetoresistance curves are plotted as magnetoresistance versus applied magnetic field. The magnetoresistance curves of an AP-pinned spin valve exhibit two critical magnetic fields, $H^+$ and $H^-$, which originate from the reversal of the antiferromagnetically coupled pinned and reference layers from antiparallel to parallel alignment. If the device is operated in fields that exceed either $H^+$ or $H^-$, it becomes unstable, seen as hysteresis in the magnetoresistance curves. FIG. 8 is a magnetoresistance curve of an AP-pinned spin valve with critical fields $H^+$ and $H^-$ indicated. The structure of this spin valve, represented as underlayer/pinning layer/pinned layer/coupling layer/reference layer/conductive layer/free layer/capping layers, is $Co_3O_4$ (10 nm)/$CoFe_2O_4$ (10 nm)/$CO_{0.84}Fe_{0.16}$ (2 nm)/Ru (0.8 nm)/$Co_{0.84}Fe_{0.16}$ (1.5 nm)/Cu (2.5 nm)/$Co_{0.84}Fe_{0.16}$ (0.5 nm)/$Ni_{80}Fe_{20}$ (4 nm)/Ru (3 nm). $H^+$ and $H^-$ are defined by the magnetic fields at which the tangents to the magnetoresistance curve intersect each other. The coercivity, $H_c$, is defined as the field at which the magnetoresistance ratio drops to half of its maximum value.

Figure 9:
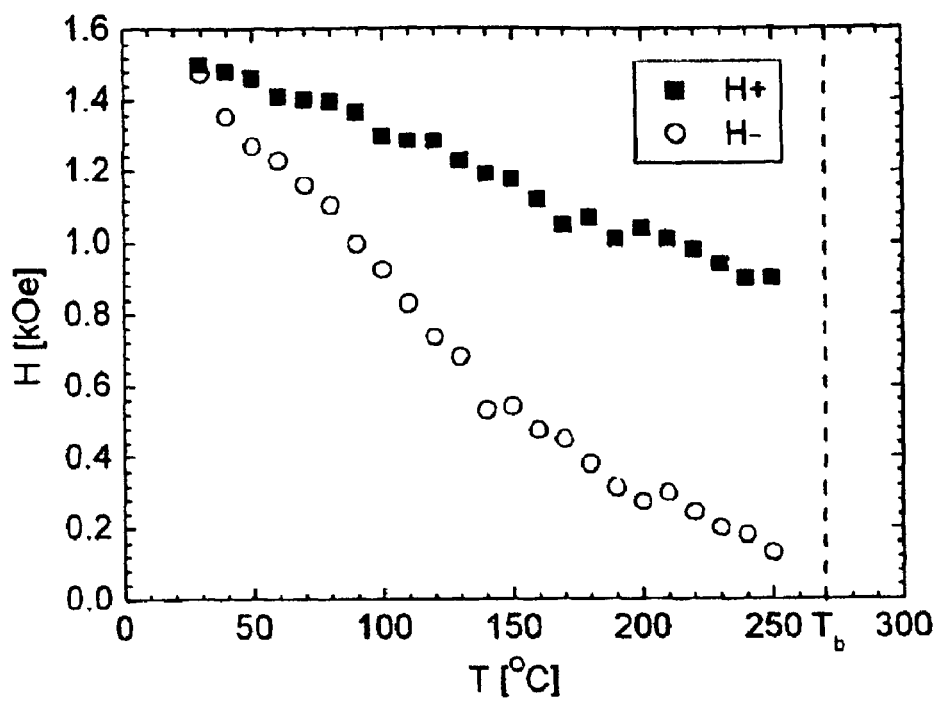
FIG. 9 is a plot of the critical magnetic fields $H^-$ and $H^+$ versus temperature for the AP-pinned spin valve of FIG. 8.

Magnetoresistance curves were obtained for the same AP-pinned spin valve at a series of temperatures to determine the variation of $H^+$ and $H^-$ with temperature, plotted in FIG. 9. $H^+$ and $H^-$ decrease almost linearly with temperature, with $H^+$ greater than $H^-$ at all temperatures. The blocking temperature, $T_b$, is defined as the temperature at which $H^-$ is zero. The spin valve is unstable at temperatures exceeding $T_b$, and so it is desirable that the blocking temperature be greater than standard operating temperatures of the device. For the AP-pinned spin valve in FIGS. 8 and 9, $T_b$ is approximately 270 degrees C. At 130 degrees C., a typical read head operating temperature, $H^-$ is approximately 700 Oe and $H^+$ is approximately 1300 Oe. Without an appropriate underlayer, sufficiently high blocking temperatures are achieved only for cobalt-ferrite layers that are tens of nanometers thick.

Figure 10:
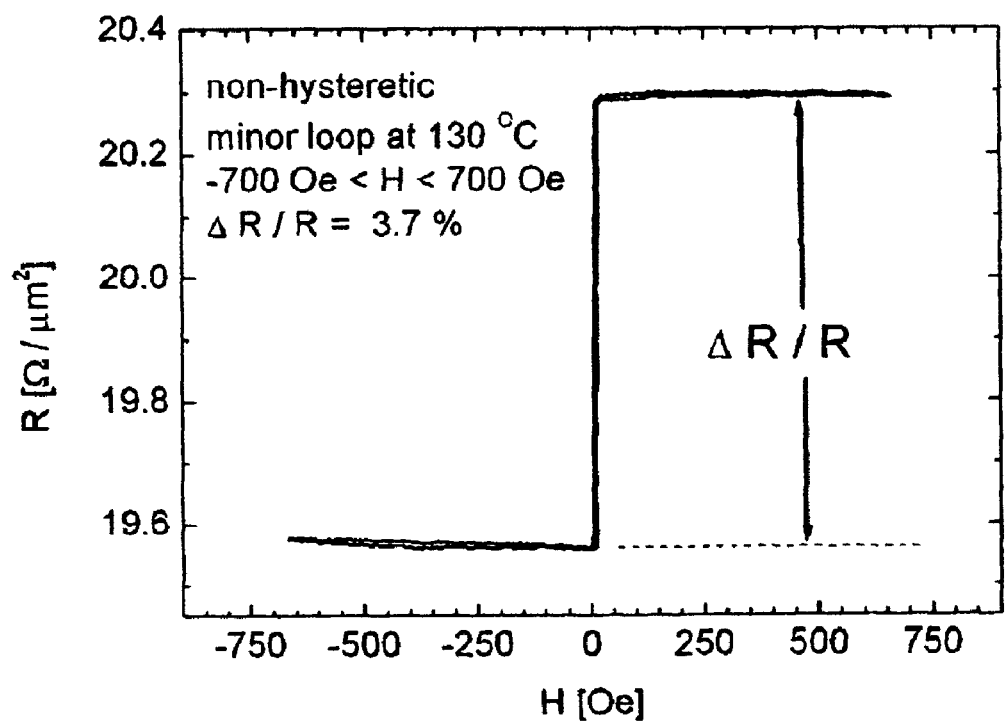
FIG. 10 shows a minor loop (magnetoresistance versus pinning field) for the AP-pinned spin valve of FIG. 8 at 130.degree. C.

A minor magnetoresistance curve as a function of applied magnetic field for the AP-pinned spin valve of FIG. 8 at 130 degrees C. is shown in FIG. 10. The exchange bias field varies from −700 to 700 Oe. The loop is very square and non-hysteretic for fields up to 700 Oe, allowing bistable operation of the sensor within these field limits at 130 degrees C. Note that the magnetoresistance ratio ΔR/R drops to 3.7% at this temperature.

Figure 11:
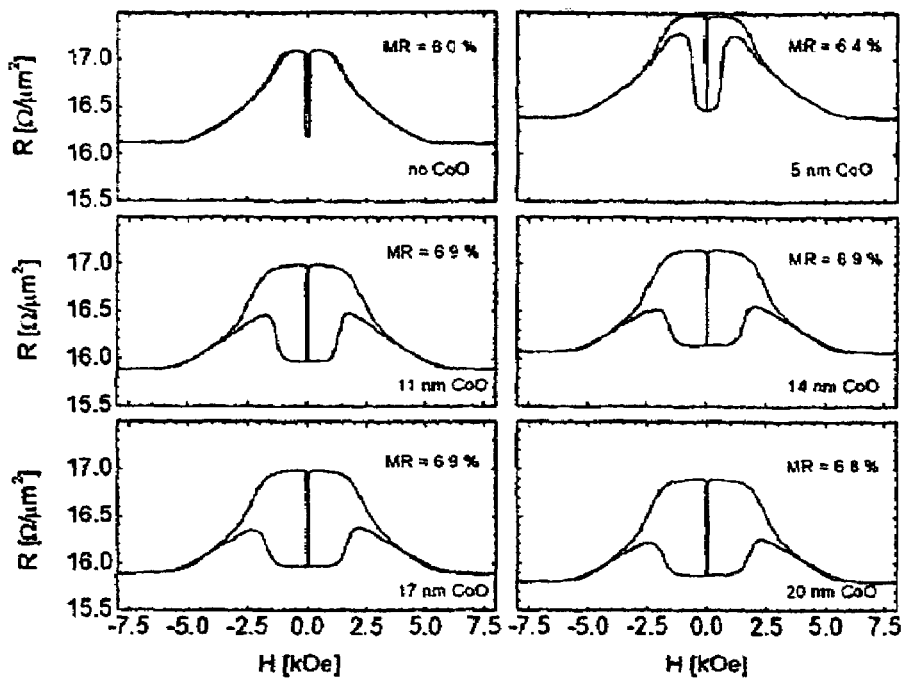
FIG. 11 is a series of magnetoresistance curves for AP-pinned spin valves with different CoO underlayer thicknesses and structures of CoO (x nm)/$CoFe_2O_4$ (3 nm)/Co (3 nm)/Ru (0.7 nm)/Co (2 nm)/Cu (2.5 nm)/Co (0.5 nm)/$Ni_{80}Fe_{20}$ (4 nm)/Ru (3 nm).

FIG. 11 shows magnetoresistance curves of AP-pinned spin valves with a 3-nm Co-ferrite thickness and different CoO underlayer thicknesses. All plots show $H^+$ curves higher than $H^-$ curves. The spin valve structure is CoO (x nm)/$CoFe_2O_4$ (3 nm)/Co (3 l nm)/Ru (0.7 nm)/Co (2 nm)/Cu (2.5 nm)/Co (0.5 nm)/$Ni_{80}Fe_{20}$ (4 nm)/Ru (3 nm). $H^-$ is zero in the absence of a CoO underlayer but increases to almost the same value as $H^+$ as the thickness of the CoO underlayer increases, showing the increase in device stability with increasing underlayer thickness.

Figure 12:
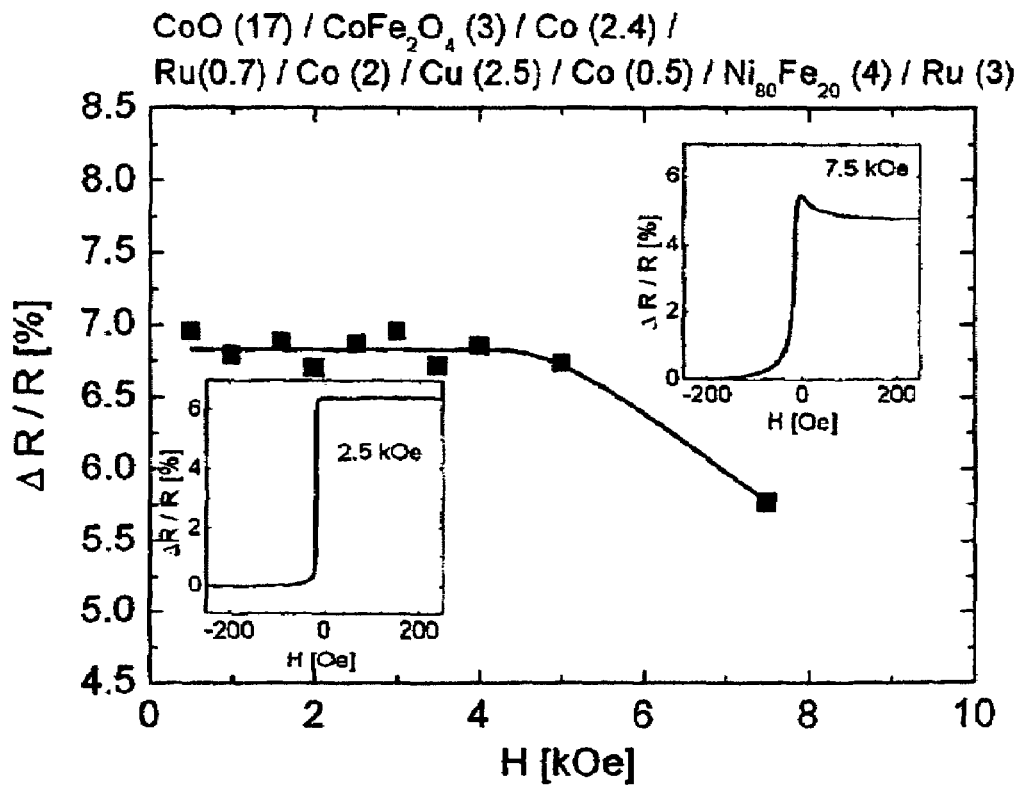
FIG. 12 shows minor loops obtained after successively applying magnetic fields of increasing magnitude in the transverse direction to an AP-pinned spin valve with a structure of CoO (17 nm)/$CoFe_2O_4$ (3 nm)/Co (2.4 nm)/Ru (0.7 nm)/Co (2 nm)/Cu (2.5 nm)/Co (0.5 nm)/$Ni_{80}Fe_{20}$ (4 nm)/Ru (3 nm).

The stability of the devices with underlayers to transverse fields, such as might be encountered when setting the direction of longitudinal bias with an external field, was tested by measuring a minor loop after successively applying magnetic fields of increasing magnitude in the transverse direction, that is, the in-plane magnetically hard axis of the pinned layer. FIG. 12 plots the magnetoresistance as a series of transverse fields are applied to an AP-pinned spin valve with the following structure: CoO (17 nm)/$CoFe_2O_4$ (3 nm)/Co (2.4 nm)/Ru (0.7 nm)/Co (2 nm)/Cu (2.5 nm)/Co (0.5 nm)/$Ni_{80}Fe_{20}$ (4 nm)/Ru (3 nm). Transverse fields are applied in approximately 500 Oe increments. The magnetoresistance ratio stays constant at ~7% with increasing fields up to about 5 kOe, after which the device becomes unstable, indicated by a decrease in magnetoresistance ratio. The two insets show minor loops obtained after applying 2.5 kOe and 7.5 kOe fields. The loop after applying a 7.5 kOe field exhibits a typical overshoot, indicating instability of the pinned layer, while the loop after applying a 2.5 kOe field still exhibits high squareness. These spin valve are therefore considerably more stable than spin valves with cobalt-ferrite pinning layers without CoO underlayers, in which reversal begins at fields as low as 1.5 kOe.

FIGS. 6–12 clearly illustrate that a very thin layer of cobalt-ferrite can be used as a pinning layer when deposited above a cobalt-oxide underlayer. The key feature of the pinning layer to fix the moment of the pinned layer at room temperature as well as elevated temperatures and its stability versus transverse fields have been demonstrated.

Figure 13A:
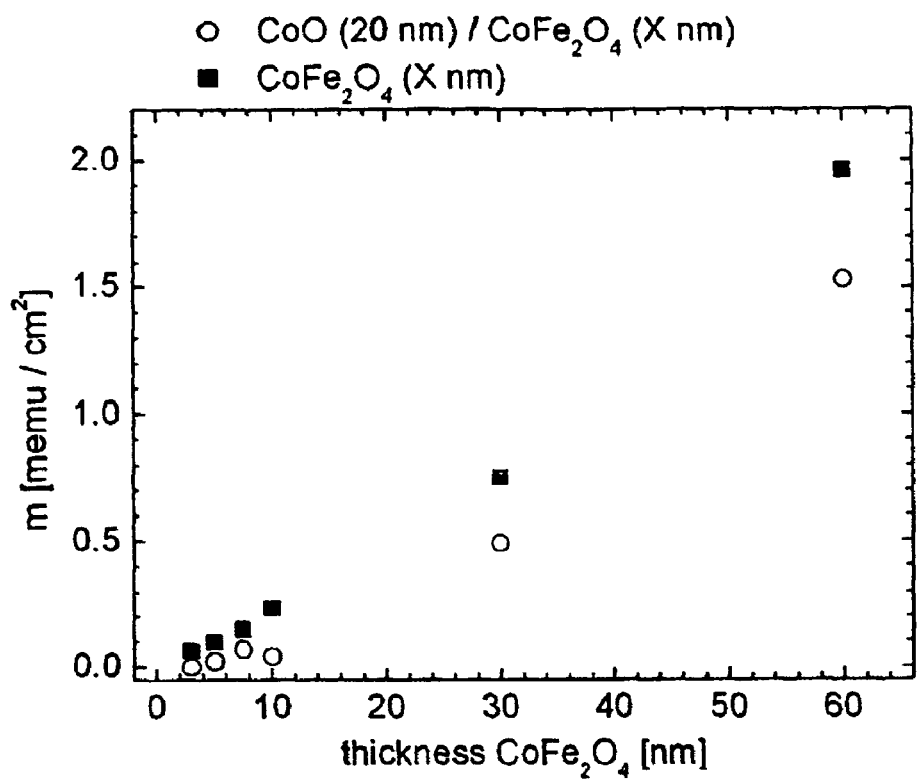
FIGS. 13A–13B are plots of magnetic moment per area and coercivity, respectively, versus film thickness of $CoFe_2O_4$ films grown onto Si/$SiO_x$ alone and onto CoO (20 nm) on Si/$SiO_x$.
Figure 13B:
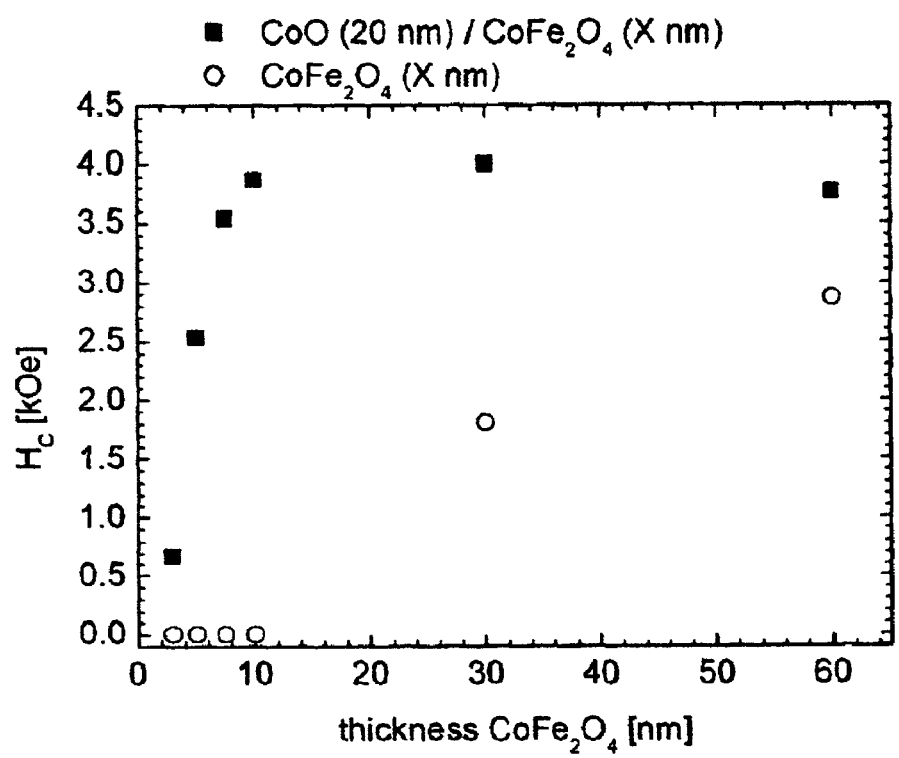

To quantify the impact of the underlayer on the stability of the $CoFe_2O_4$ pinning layer, $CoFe_2O_4$ films of various thickness were grown directly onto Si/$SiO_x$ and with a 20 nm CoO underlayer between the pinning layer and the Si/$SiO_x$ substrate. FIGS. 13A and 13B show the magnetic moment per area and coercivity, respectively, of the structure as a function of $CoFe_2O_4$ thickness. The samples grown onto the 20-nm CoO underlayers exhibit both higher moment and higher coercivity than those without the underlayer for all $CoFe_2O_4$ thicknesses. This behavior (combined with the TEM images of FIGS. 4A–4C) suggests that fewer grains order in the $CoFe_2O_4$ phase without an underlayer. The coercivity of the films with the CoO underlayer increases steeply from 0.7 kOe for a 3 nm $CoFe_2O_4$ film to .about.4.0 kOe for all $CoFe_2O_4$ films thicker than 10 nm. In sharp contrast, the films without an underlayer exhibit no coercivity up to 10 nm, and even for a 60 nm film, the coercivity is more than 1 kOe smaller than the film with an underlayer.

While the exchange-coupled magnetic structure of the invention has been described in only simple and AP-pinned spin valve MR sensors, it can be implemented in all of the MR sensors described in U.S. patent application Ser. No. 09/755,556, filed Jan. 4, 2001, (issued as U.S. Pat. No. 6,721,144 to Carey, et al. Apr. 13, 2004) which was incorporated by reference above. For example, the underlayer can be used in spin valves containing AP-free structures or extra AFM layers between the pinning and pinned layers.

Second Embodiment—Hard Biasing for Spin-Valves and Magnetic Tunnel Junctions

This embodiment of the invention relates to exchange-coupled structures such as spin valves and magnetic tunnel junctions (MTJs). MTJs have been proposed for magnetic memory cells (MRAM) and magnetoresistive read heads. A magnetic tunnel junction consists of two ferromagnetic layers separated by an insulating non-magnetic tunneling barrier. The barrier is thin enough that quantum-mechanical tunneling occurs between the ferromagnetic layers. Since the tunneling probability is spin-dependent, the tunneling current is a function of the relative orientation of the two magnetic layers. Thus a MTJ can serve as a MR sensor. For a constant applied voltage, the resistance of the MTJ changes from a low to a high state as the relative orientation of the two ferromagnetic layers changes. Depending upon the electronic band structure of the two ferromagnetic layers, either parallel or antiparallel alignment of the ferromagnetic layers defines the high or the low state of the MTJ.

In order to obtain a linear response of a spin valve or magnetic tunnel junction MR sensor, the magnetization of the free layer must be oriented perpendicular to the magnetically pinned layer in the absence of an external signal field. In addition, a biasing field is applied through an external hard ferromagnetic layer with a remanent moment that is several times the saturation moment of the sense (free) layer. Without this hard-biasing layer, the magnetic moments in the free layer tend to establish a multi-domain state, leading to highly undesirable domain reorientation phenomena in the presence of external magnetic fields.

Figure 14:
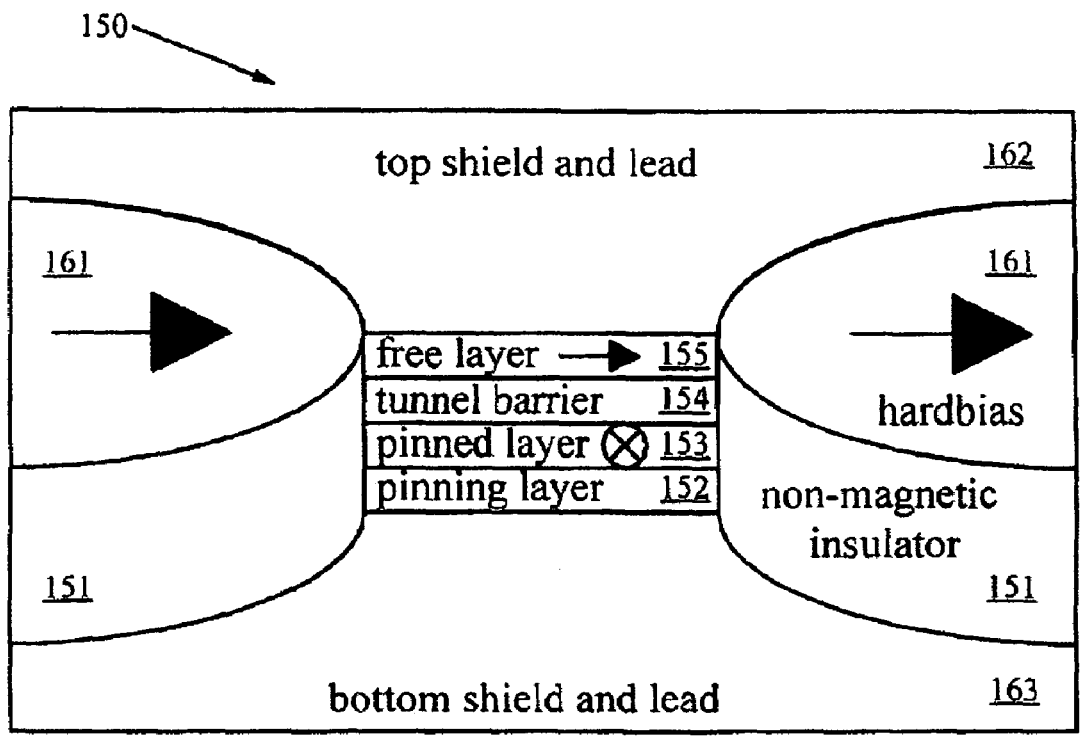
FIG. 14 is a cross-sectional view of a magnetic tunnel junction MR sensor with hard biasing performed according to the present invention.

In order to use a MTJ as a magnetoresistive sensor, bistability is necessary. One solution is shown in FIG. 14, a cross-sectional view of a longitudinal biased magnetic tunnel junction 150 for use in a MR sensor of a read head or a magnetic memory cell. MTJ 150 consists of a pinned ferromagnetic layer 153 and a free ferromagnetic layer 155 separated by an insulating tunnel barrier 154. A pinning layer 152 fixes the magnetic moment of pinned ferromagnetic layer 153. A capping layer (not shown) is typically added to prevent corrosion. A hard-biasing layer 161 sets the direction of the free layer magnetization via magnetostatic interaction. A top shield and lead 162 and bottom shield and lead 163 contact free ferromagnetic layer 155 and pinning layer 152, respectively, to supply sense current.

MTJ 150 also contains at least one non-magnetic, insulating underlayer 151 that controls the growth of hard-biasing layer 161. For the present invention, hard-biasing layer 161 is a coercive ferrite pinning layer such as $CoFe_2O_4$, and underlayer 151 is an oxide underlayer with a rock salt or spinel lattice structure. A full description of potential materials for hard-biasing layer 161 and underlayer 151 are discussed above with reference to pinning layer 132 and oxide underlayer 134 of spin valve MR sensor 130 shown in FIGS. 3A and 3B. As described above with reference to spin valves, underlayer 151 improves the coercivity and thermal stability of the hard-biasing layer 161 and thus improves the stability of free layer 155 in the MTJ 150.

Figure 15:
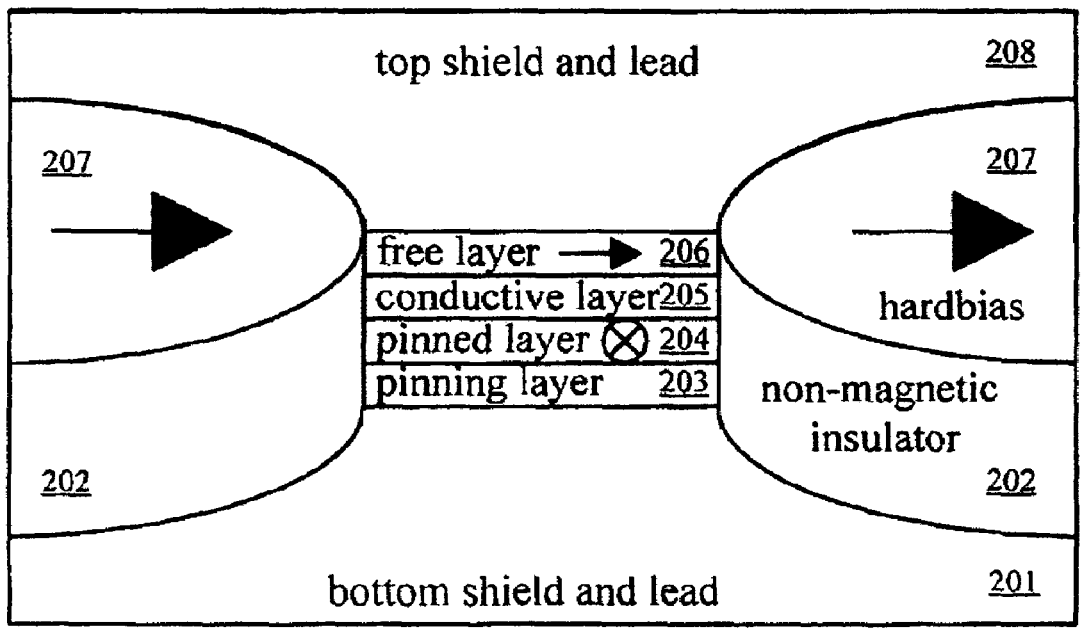
FIG. 15 is a cross-sectional view of a current perpendicular-to-the-plane (CPP) MR sensor with hard biasing performed according to the present invention.

A current perpendicular-to-the-plane (CPP) spin-valve MR sensor 200 is shown in cross-section in FIG. 15. Sensor 200 is deposited onto a bottom shield and lead 201 and consists of a pinning layer 203, a pinned ferromagnetic layer 204, a conductive layer 205, and a free ferromagnetic layer 206. A hard-bias material 207 is deposited onto a material 202 that exhibits no magnetic moment at room temperature. Sensor 200 is terminated with a top shield and lead 208. Since coercive ferrites such as $CoFe_2O_4$ are insulating ferrimagnets, they can be used as hard-bias material 207. Insulating material 202 is an underlayer according to the present invention, i.e., an oxide with a rock salt or spinal crystalline structure as described in detail above, exhibiting no magnetic moment at room temperature. Underlayer 202 enhances the thermal stability of coercive ferrite hard-bias layer 207. A simple current-perpendicular to the plane spin-valve 200 is structurally similar to a MTJ, but the insulating tunnel barrier is replaced by a conductive layer 205.

To prevent shunting in a CPP spin-valve or MTJ device, the hard-biasing material must be spatially separated from the sensor when a metallic material is used for hard-biasing. However, if an insulating material is used, it can be deposited in direct contact with the sensor. Since the strength of the magnetostatic interaction is proportional to the remnant moment of the hard-biasing material and decreases with distance, a thinner layer of hard-biasing material can be deposited in contact with the free layer than spatially separated from the free layer. The exchange-coupled magnetic structure of the present invention is very well suited for this application.

Figure 1:
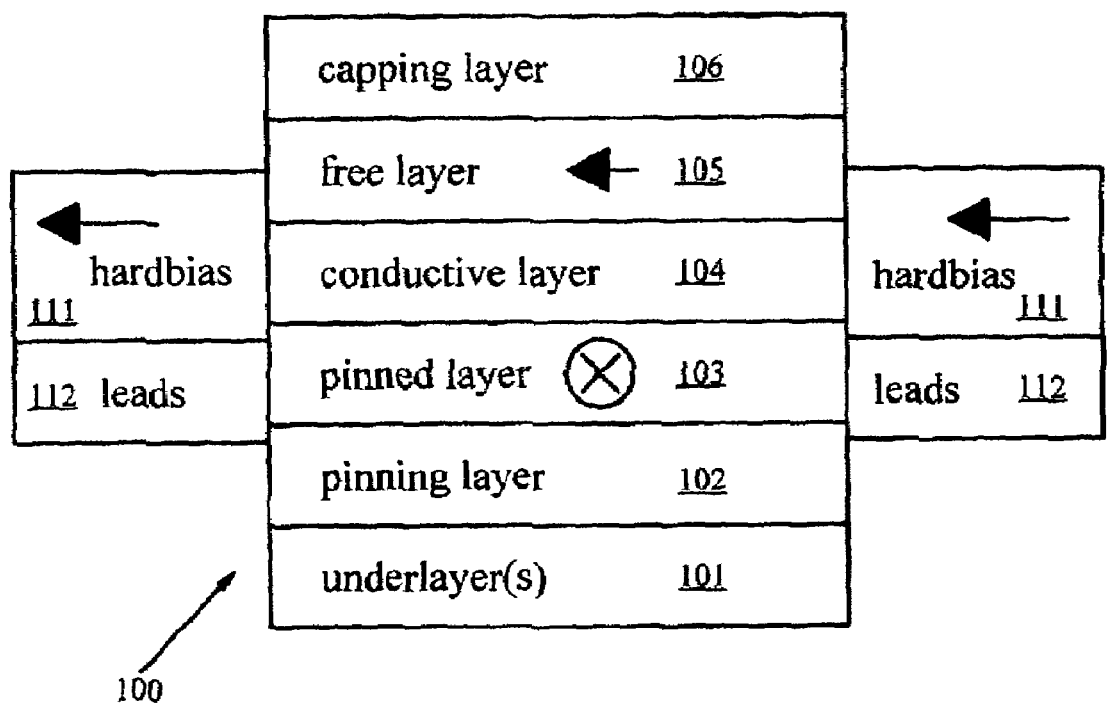
FIG. 1 is a cross-sectional view of a simple spin valve MR sensor of the prior art.
Figure 2:
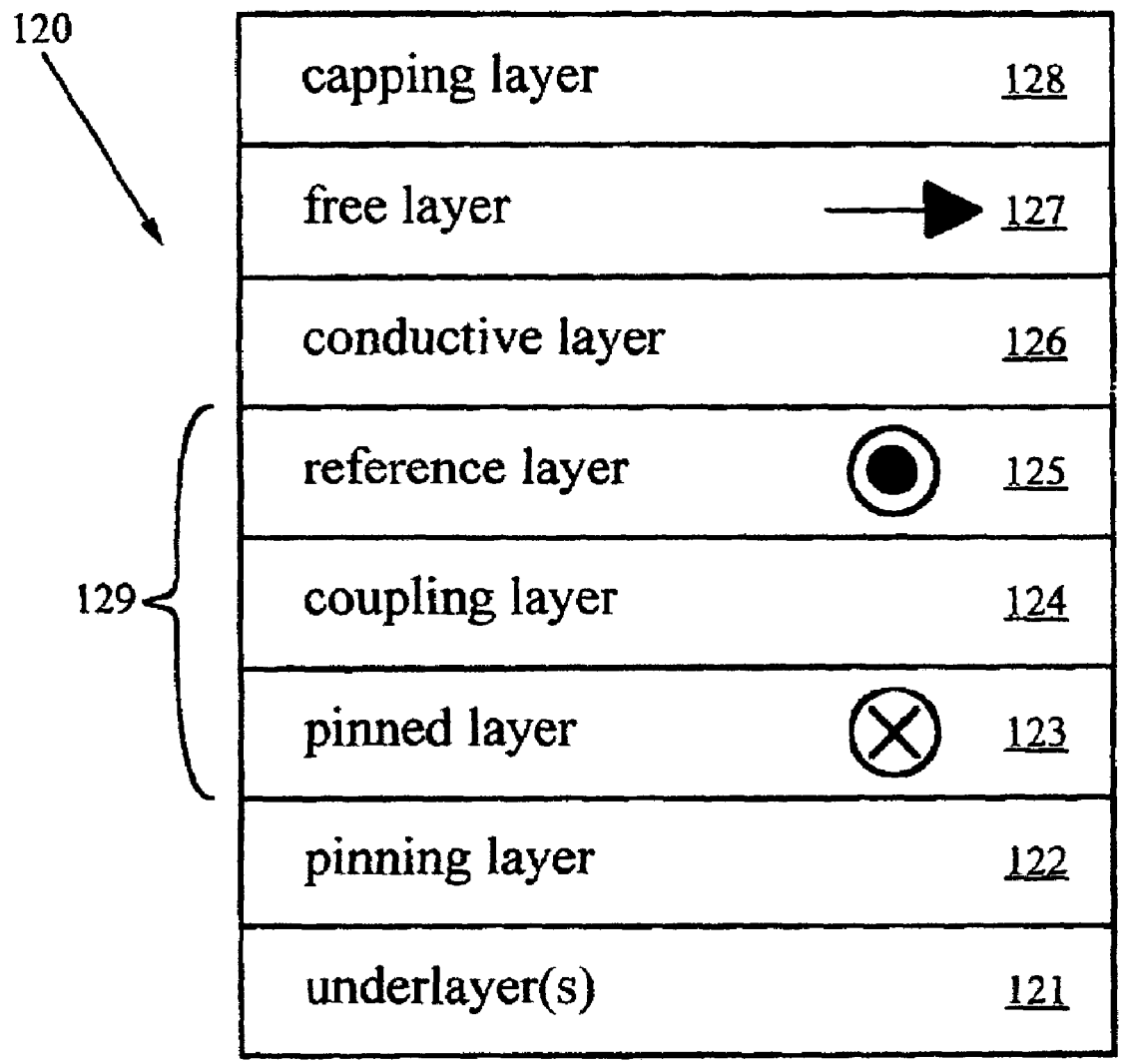
FIG. 2 is a cross-sectional view of an AP-pinned spin valve MR sensor of the prior art.

Although not shown, this embodiment of the invention can be used in simple current-in-plane (CIP) spin valves such as spin valve 100 of FIG. 1. It can also be used in antiparallel-pinned and dual spin valves (CIP and CPP).

Third Embodiment: In-Stack Biasing of Spin Valve MR Sensors

Instead of hard-biasing a current-in-plane (CIP) spin valve MR sensor from the side, as in FIG. 1, an in-stack-biasing scheme can alternatively be used. In this case, the biasing material of the free layer is deposited in direct contact with and parallel to the free layer. One advantage of using in-stack biasing rather than hard-biasing from the side is that fewer processing steps are necessary to fabricate the read head sensor.

Figure 16:
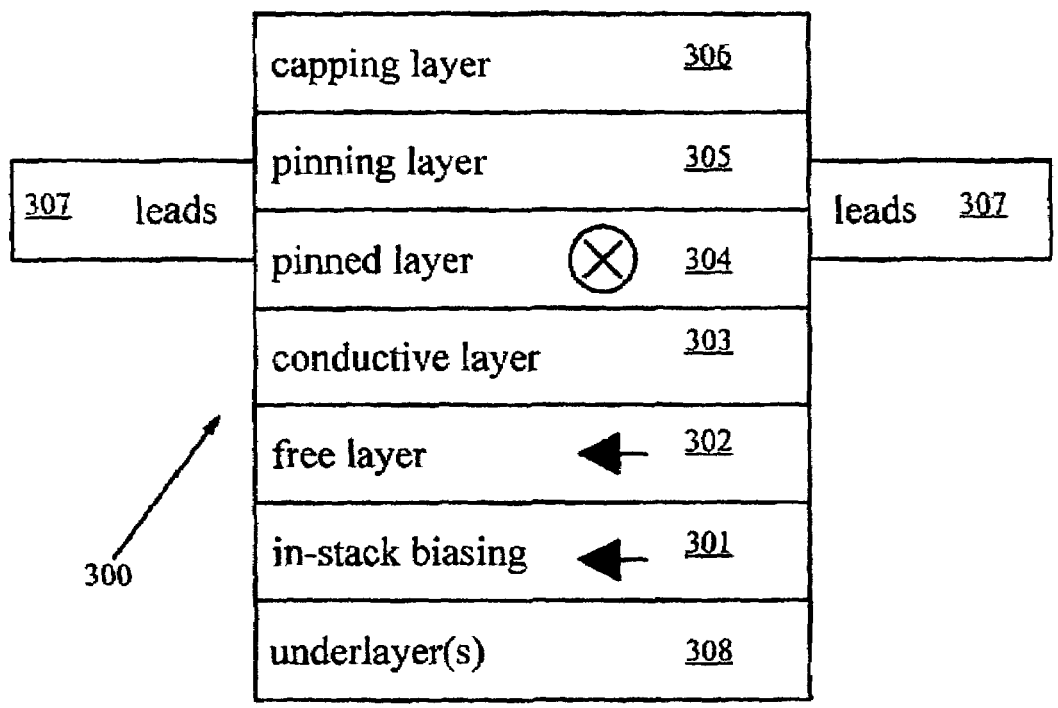
FIG. 16 is a cross-sectional view of a spin valve MR sensor with in-stack biasing performed according to the present invention.

FIG. 16 shows in cross section a simple spin valve MR sensor 300 with insulating in-stack biasing. An analogous scheme can be used for AP-pinned spin valves (not shown). As shown, sensor 300 is grown in reverse of the previously discussed devices. A coercive ferrite in-stack biasing layer 301 is deposited onto an oxide underlayer 308, followed by a free ferromagnetic layer 302. Biasing layer 301 and oxide underlayer 308 are layers of the present invention as described above with reference to pinning layer 132 and oxide underlayer 134 of FIGS. 3A and 3B. As described above, biasing layer 301 provides sufficient biasing at a smaller thickness than would be required without oxide underlayer 308. Subsequently deposited layers are a conductive layer 303, a pinned ferromagnetic layer 304, a pinning layer 305, and a capping layer 306. Pinned ferromagnetic layer 304 has its magnetic moment pinned perpendicular to the magnetic moment of free ferromagnetic layer 302. For a current-in-plane (CIP) geometry, leads 307 contact pinned layer 304. For a current perpendicular-tothe-plane (CPP) geometry, a second set of leads (not shown) is deposited in contact with free layer 302.

It is to be understood that the exchange-coupled magnetic structure of the present invention can be used in any suitable device, not only the devices described in the three embodiments above.

Figure 17:
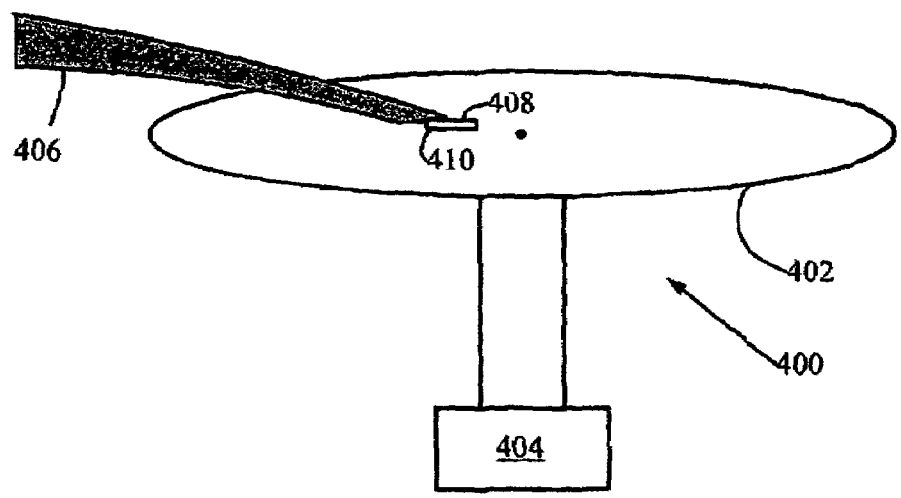
FIG. 17 is a schematic diagram of a disk drive system of the present invention including an exchange-coupled magnetic structure.

FIG. 17 is a schematic diagram of a disk drive system 400 containing a magnetic recording disk 402 rotated by a motor 404. An actuator 406 holds a magnetoresistive read/write head 408 and moves read/write head 408 across magnetic recording disk 402. MR read/write head 408 contains a magnetoresistive sensor 410 incorporating at least one exchange-coupled magnetic structure of the present invention. Rotation of magnetic recording disk 402 and movement of actuator 406 allows MR read/write head 408 to access different regions of magnetically recorded data on magnetic recording disk 402.

It will be clear to one skilled in the art that the above embodiments may be altered in many ways without departing from the scope of the invention. Accordingly, the scope of the invention should be determined by the following claims and their legal equivalents.

What is claimed is:

1. A magnetoresistive (MR) sensor comprising;
   a) a ferromagnetic layer structure including first and second ferromagnetic layers separated by a nonmagnetic layer;
   b) a coercive ferrite layer biasing a magnetization of the ferromagnetic layer structure; and
   c) an oxide underlayer under the coercive ferrite layer, the oxide underlayer being deposited prior to the coercive ferrite layer to influence growth characteristics of the coercive ferrite layer, the oxide underlayer having a spinel lattice structure and exhibiting no magnetic moment at room temperature.

2. The MR sensor of claim 1 wherein the oxide underlayer comprises a material selected from the group consisting of $Co_3O_4$, $MgAl_2O_4$, and their alloys.

3. The MR sensor of claim 1 wherein the MR sensor is a spin valve MR sensor.

4. The MR sensor of claim 3 wherein the second ferromagnetic layer is a pinned layer and the coercive ferrite layer is a pinning layer that pins the magnetization of the second ferromagnetic layer.

5. The MR sensor of claim 4 wherein the second ferromagnetic layer is a free layer and the coercive ferrite layer is an in-stack biasing layer that biases the magnetization of the free layer.

6. The MR sensor of claim 1 wherein the sensor is an antiparallel-pinned spin valve MR sensor.

7. The MR sensor of claim 1 wherein the sensor is a dual spin value MR sensor.

8. The MR sensor of claim 1 wherein the MR sensor is a magnetic tunnel junction MR sensor.

9. The MR sensor of claim 1 wherein the coercive ferrite layer comprises a material selected from the group consisting of $Co_xFe_{3-x}O_4$, wherein $0 \leq x \leq 1.5$, $SrFe_{12}O_{19}$, $BaFe_{12}O_{19}$, and their alloys.

10. The MR sensor of claim 1 wherein the coercive ferrite layer comprises an alloy comprising an element selected from the group consisting of Si, Ti, Mg, Al, Mo, Os, Re, Ru, and W.

11. The MR sensor of claim 1 wherein the coercive ferrite layer comprises $CoFe_2O_4$.

12. The MR sensor of claim 1 wherein the coercive ferrite layer has a thickness of between 1 and 30 nm.

13. The MR sensor of claim 1, further comprising an upper shield and a lower shield defining a gap, wherein the gap contains the ferromagnetic layer, the coercive ferrite layer, and the oxide underlayer and has a width of less than 50 nm.

14. The MR sensor of claim 1 wherein the coercive ferrite layer is deposited onto the oxide underlayer.

15. The MR sensor of claim 1, further comprising an intermediate layer between the oxide underlayer and the coercive ferrite layer, the intermediate layer being deposited on the oxide underlayer and preserving the growth characteristics established by the oxide underlayer.

16. An exchange-coupled magnetic structure comprising:
   a) a ferromagnetic layer structure including first and second ferromagnetic layers separated by a nonmagnetic layer;
   b) a coercive ferrite layer, wherein an exchange bias field from the coercive ferrite layer biases the magnetization of the ferromagnetic layer structure; and
   c) an oxide underlayer under the coercive ferrite layer, the oxide underlayer being deposited prior to the coercive ferrite layer to influence growth characteristics of the coercive ferrite layer, the oxide undertaker having a spinel lattice structure and exhibiting no magnetic moment at room temperature.

17. The exchange-coupled magnetic structure of claim 16, wherein the second ferromagnetic layer is a free layer whose magnetization is biased by the coercive ferrite layer, and the first ferromagnetic is a pinned ferromagnetic layer.

* * * * *